United States Patent [19]

Sugiyama et al.

[11] Patent Number: 4,779,016
[45] Date of Patent: Oct. 18, 1988

[54] LEVEL CONVERSION CIRCUIT

[75] Inventors: Hisashi Sugiyama; Yasuhiro Sugimoto, both of Yokohama, Japan

[73] Assignee: Kabushiki Kaisha Toshiba, Kawasaki, Japan

[21] Appl. No.: 849

[22] Filed: Jan. 6, 1987

[30] Foreign Application Priority Data

Jan. 8, 1986 [JP] Japan .................. 61-653

[51] Int. Cl.⁴ .................. H03K 19/092; H03K 19/094
[52] U.S. Cl. .................. 307/475; 307/264; 307/362
[58] Field of Search .............. 307/264, 451, 455, 467, 307/469, 475, 362

[56] References Cited

U.S. PATENT DOCUMENTS 4,453,095 6/1984 Wrathall ...................... 307/475

FOREIGN PATENT DOCUMENTS 0102218 3/1984 European Pat. Off. .
0146910 7/1985 European Pat. Off. ........ 307/475
0173288 3/1986 European Pat. Off. .
3346529 8/1984 Fed. Rep. of Germany .

Primary Examiner—John Zazworsky
Attorney, Agent, or Firm—Oblon, Fisher, Spivak, McClelland & Maier

[57] ABSTRACT

Level conversion circuit for converting ECL logic level signals to CMOS logic level signals. The level conversion circuit includes: a differential amplifier circuit, which has a bipolar transistor of which the base terminal is connected to an input terminal and a bipolar transistor of which the base terminal is connected to a bias source, and which selects a current path from a high voltage source to a low voltage source; an MOS type transistor whose conduction is controlled by current flowing through the collector terminal of one of said bipolar transistors; a P-channel MOS type transistor, connected between the high voltage source and an output terminal, whose conduction is controlled either by the collector terminal current flowing through the collector terminal of the other of said bipolar transistors or by the drain terminal current flowing between the source terminal and the drain terminal of said MOS transistor; and an N-channel MOS type transistor, connected between the low voltage source and the output terminal, whose conduction is controlled either said collector terminal current or by said drain terminal current.

2 Claims, 2 Drawing Sheets

LEVEL CONVERSION CIRCUIT

BACKGROUND OF THE INVENTION

1. Field of the Invention

The present invention relates to a level conversion circuit, and more particularly to a level conversion circuit for converting a signal level of ECL (Emitter-Coupled Logic) to a signal level of CMOS (Complementary Metal Oxide Semiconductor).

2. Description of the Prior Art

Recently, so-called Bi-CMOS circuits have come into popular in semiconductor circuit fields. The Bi-CMOS circuits have a combined structure of bipolar circuits and CMOS circuits formed together on one single chip. Bipolar circuits such as ECL LSIs typically provide fast circuit speeds, reduced delay per unit load, and have historically been the predominate technology applied in ICs (Integrated Circuits). CMOX circuits provide high noise immunity, high input impedance, and low power consumption, and have rapidly gained acceptance in the industry. Thus the Bi-CMOS circuits may have the features of both the bipolar circuits and the CMOS circuits.

To use CMOS LSIs (Large Scale Integrated circuits) together with ECL LSIs, the input-output signal levels of both LSIs must be matched and in particular, an interface circuit for converting a signal of an ECL level (high level; about—0.7 volts, low level; about—2.5 volts) to a signal level of a CMOS level (high level; power source potential, i.e., about 5.0 volts, low level; ground potential, i.e., around 0 volts) is necessary.

One previsouly known circuit converting the ECL logic level to the CMOS logic level comprises a pair of differentially connected first and second NPN transistors, a current source connected between the common emitter terminals of the first and second NPN transistors and a ground potential source, a first P-channel MOS transistor (referred as PMOS transistor hereafter) and a pair of complementally connected second PMOS transistor and an N-channel MOS transistor (referred as NMOS transistor hereafter). The first NPN transistor has a collector terminal connected directly to a power source with a potential of about 5.0 volts and a base terminal connected to a non-inverse input terminal for receiving non-inversed ECL logic signal. The second NPN transistor has a collector terminal connected to a power source via the source-drain path of the first PMOS transistor and a base terminal connected to an inverse input terminal for receiving inversed ECL logic signal. The second PMOS transistor has a source terminal connected to the power source, a drain terminal connected to an output terminal for outputting a CMOS level signal and a gate terminal connected to a gate terminal of the first PMOS transistor. The NMOS transistor has a source terminal connected to the ground potential source, a drain terminal connected to the output terminal and a gate terminal connected to a gate terminal bias source. The common gate terminals of the first and second PMOS transistors are connected to the collector terminal of the second NPN transistor.

When high and low level ECL Logic signals are applied to the non-inverse and inverse input terminals respectively, the first NPN transistor becomes conductive while the second NPN transistor becomes non-conductive. In this state, the first and second PMOS transistors connected to the second NPN transistor are rendered non-conductive together. The NMOS transistor is however rendered conductive, since its gate terminal is applied a gate terminal bias from the gate terminal bias source. Thus a current flows into the NMOS transistor from a load connected to the output terminal. Therefore the output terminal becomes the ground potential level, i.e., the low CMOS logic level.

When on the other hand low and high level ECL Logic signals are applied to the non-inverse and inverse input terminals respectively (opposite to the above case), the first NPN transistor becomes non-conductive while the second NPN transistor becomes conductive. In this state, the collector terminal of the second NPN transistor becomes a low level near the ground potential. The first and second PMOS transistors are both rendered conductive since their gate terminals are connected to the collector terminal of the second NPN in the low level. In this state, the second PMOS transistor flows a current from the power source to the output terminal, which is larger than the current flowing through the NMOS transistor. This causes the potential of the output terminal to be the potential of the power source, i.e., the high CMOS logic level.

Thus the conventional level conversion circuit converts the level of the ECL logic signal to the level of the CMOS logic signal.

In the circuit, however, the gate terminal bias potential is so set that the NMOS transistor always operates in the non-saturation region. Therefore, the NMOS transistor fails to give its maximum ability for flowing the load current from the output terminal to the ground potential source when the high and low level ECL Logic signals are applied to the non-inverse and inverse input terminals respectively. As a result, the level conversion circuit fails to change the output level on the output terminal to the low CMOS logic level at a rapid speed. Further, the current flowing the second PMOS transistor flows partially into the NMOS transistor when the low and high level ECL Logic signals are applied to the non-inverse and inverse input terminals respectively. This also fails to cause the circuit to change the output level on the output terminal to the high CMOS logic level at a rapid speed. Thus the conventional level conversion circuit had the drawback that it is difficult to perform the level conversion in a rapid circuit speed.

The conventional level conversion circuit has also another drawback that it consumes a relatively large power. That is, the NMOS transistor operates in accompanying with a tolerable amount of impedance when the high and low level ECL Logic signals are applied to the non-inverse and inverse input terminals of the circuit. Because the NMOS transistor is biased to the operation in the non-saturation region. Also the NMOS transistor continues to operate and flows a relatively large amount of current therethrough after when the ECL Logic signals changed to the opposite polarities. Then the NMOS transistor unnecessarily consumes a fairly large amount of power both when the circuit outputs the high and low CMOS logic level outputs.

SUMMARY OF THE INVENTION

Accordingly, an object of the present invention is to provide a level conversion circuit which is able to convert an ECL logic level signal to a CMOS logic level signal in a relatively rapid speed.

Another object of the present invention is to provide a level conversion circuit which is able to convert an ECL logic level singal to a CMOS logic level signal with a relatively low power consumption.

In order to achieve the above objects, the level conversion circuit according to the present invention includes a differential amplifier circuit which has a bipolar transistor of which the base terminal is connected to an input terminal and a bipolar transistor of which the base terminal is connected to a bias source, and which selects a current path from a high voltage source to a low voltage source, an MOS type transistor whose conduction is controlled by current flowing through the collector terminal of one of said bipolar transistors, a P-channel MOS type transistor, connected between the high voltage source and an output terminal, whose conduction is controlled either by the collector terminal current flowing through the collector terminal of the other of said bipolar transistor or by the drain terminal current flowing between the source terminal and the drain terminal of said MOS transistor, and an N-channel MOS type transistor, connected between the low voltage source and the output terminal, whose conduction is controlled either by said collector terminal current or by said drain terminal current.

DESCRIPTION OF THE PREFERRED EMBODIMENT

Figure 1:
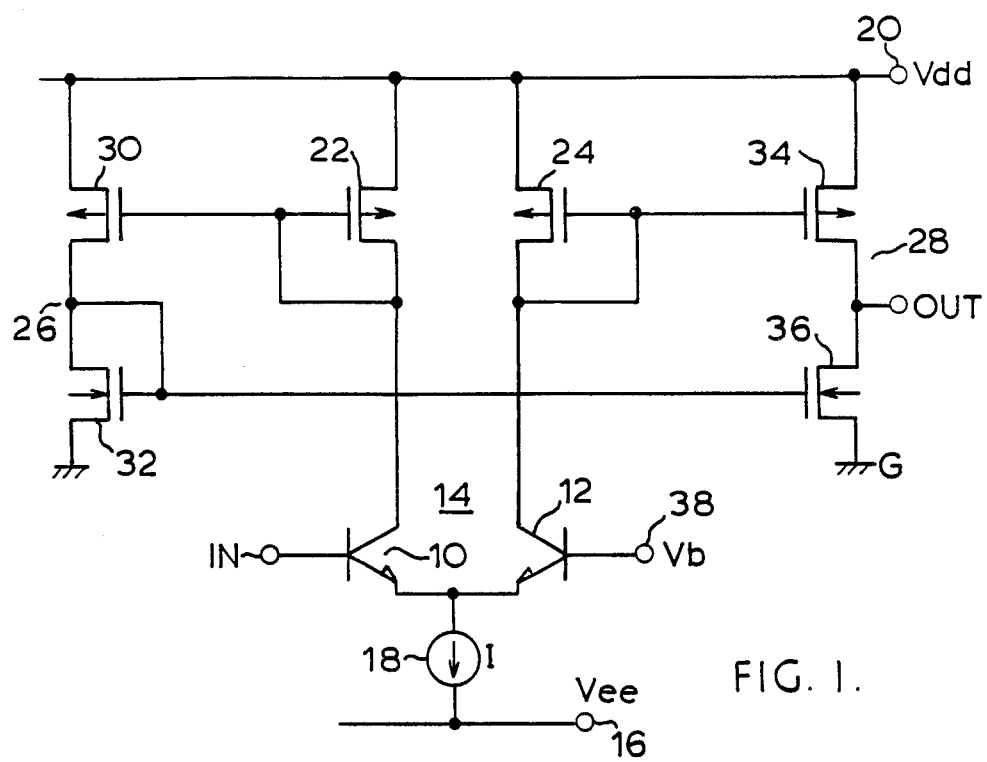
FIG. 1 is a schematic circuit diagram showing a first embodiment of the level conversion circuit according to the present invention.

The present invention will now be described in detail with reference to the accompanying drawings, namely, FIGS. 1 to 3. Throughout the drawings, like reference numerals and letters are used to designate like or equivalent elements for the sake of simplicity of explanation.

Referring now to FIG. 1, a first embodiment of the level conversion circuit according to the present invention will be described in detail. A first and second NPN transistors 10 and 12 are connected to each other in a differential circuit 14. That is, the emitter terminal of the first and second NPN tranistors 10 and 12 are connected to each other and then connected to a low potential source 16 with the low potential Vee of, e.g.,—2.5 volts through a current source 18. The first and second NPN transistors 10 and 12 have collector terminals connected to a high potential source 20 with the high potential Vdd of, e.g., 5.0 volts via source-drain paths of first and second PMOS transistors 22 and 24, respectively. That is, the first and second PMOS transistors 22 and 24 have source terminals connected to the Vdd potential source 20 and drain terminals connected to the collector terminals of the first and second NPN transistors 10 and 12, respectively. Further, first and second complementary MOS transistor circuits 26 and 28 are both connected between the Vdd potential source 20 and a ground potential source G. In the first complementary MOs transistor circuit 26, a third PMOS transistor 30 and a first NMOS transistor 32 are connected at their drain terminals to each other. While the third PMOS transistor 30 and the first NMOS transistor 32 are connected at their sources to the Vdd potential source 20 and the ground potential source G, respectively. Similarly, in the second complementary MOS transistor circuit 28, a fourth PMOS transistor 34 and a second NMOS transistor 36 are connected at their drain terminals to each other. Also the fourth PMOS transistor 34 and the second NMOS transistor 36 are connected at their sources to the Vdd potential source 20 and the ground potential source G, respectively. The gate terminals of the first and third PMOS transistors 22 and 30 are connected to each other and further to the connection node of the drain terminal of the first PMOS transistor 22 and the collector terminal of the first NPN transistor 10. Similarly, the gate terminals of the second and fourth PMOS transistors 24 and 34 are connected to each other and further to the connection node of the drain terminal of the second PMOS transistor 24 and the collector terminal of the second NPN transistor 12. The first and second NMOS transistors 32 and 36 are connected to each other and further to the connection node of the drain terminals of the third PMOS transistor 30 and the first NMOS transistor 32 in the first complementary MOS transistor circuit 26. One NPN transistor in the differential circuit 14, e.g., the first NPN transistor 10 is connected at its base terminal to an input terminal IN for receiving ECL logic signals The other NPN transistor, i.e., the second NPN transistor 12 is connected at its base terminal to a base bias potential source 38 with the intermediate potential Vb between the high and low potentials Vdd and Vee, i.e., about—1.3 volts. Further a connection node between the drain terminals of the fourth PMOS transistor 34 and the second NMOS transistor 36 on the second complementary MOS circuit 28 is connected to an output terminal OUT for outputting CMOS logic level signals.

An operation of the first embodiment of the level conversion circuit of the present invention will now be described. When high level ECL logic signals are applied to the input terminal IN, the first NPN transistor 10 is rendered conductive. On the other hand, the second NPN transistor 12 is rendered non-conductive. In this state, the first PMOS transistor 22 becomes conductive and the second PMOS transistor 24 becomes non-conductive. Then, a current which is applied from the potential source 20 to the differential circuit 14 flows through a first path of the first PMOS transistor 22 and the first NPN transistor 10. Or the current flows from the Vdd potential source 20 to the Vee potential source 16 through the first path and the current source 18.

The first PMOS transistor 22 operates like a resistor, since its gate terminal and drain terminal are connected to each other. The first PMOS transistor 22 is so set that the equivalent resistance has a fairly large amount in the conductive state. So that, the gate terminals of the first and third PMOS transistors 22 and 30 and the collector terminal of the first NPN transistor 10 are rendered in a low level state near the low potential on the Vee potential source 16. The third PMOS transistor 30 is then rendered conductive so that a current flows from the high potential source Vdd to the ground potential through the first complementary MOS circuit 32. Because the first NMOS transistor 32 also operates like a resistor with a fairly large equivalent resistance similar to that of the first PMOS transistor 22, the gate terminal of the second NMOS transistor 32 is rendered in a high level state near the high potential on the Vdd potential source 20. On the other hand, the second and fourth PMOS transistors 24 and 34 are rendered non-conductive. Therefore, a current flows from a load connected to the output terminal OUT to the ground potential source G through the second NMOS transistor 36. As a result, the high ECL logic level applied to the input terminal IN is converted to the low CMOS logic level at the output terminal OUT.

When low level ECL logic signals are applied to the input terminal IN, the first NPN transistor 10 is rendered non-conductive. On the other hand, the second NPN transistor 12 is rendered conductive in opposite to the former case. In this state, the first PMOS transistor 22 becomes non-conductive and the second PMOS transistor 24 becomes conductive. Then, a current which is applied from the current source 18 to the differential circuit 14 flows through a second path of the second PMOS transistor 24 and the second NPN transistor 12. Or the current flows from the Vdd potential source 20 to the Vee potential source 16 through the second path and the current source 18.

The second PMOS transistor 24 operates like a resistor with a fairly large equivalent resistance similar to the first PMOS transistor 22, since its gate terminal and drain terminal are connected to each other. So that, the gate terminals of the second and fourth PMOS transistors 24 and 34 and the collector terminal of the second NPN transistor 12 are rendered in a low level state near the low potential on the low potential source Vee. The fourth PMOS transistor 34 is then rendered conductive. On the other hand, the gate terminals of the first and third PMOS transistors 22 and 30 remain in the high level state since the first NPN transistor 10 is non-conductive. In this state, the gate terminal of the second NMOS transistor 36 is in the low level state. Thus the second NMOS transistor 36 is rendered non-conductive. Accordingly, a current flows from the Vdd potential source 20 to the output terminal OUT through the fourth PMOS transistor 34 in the first complementary MOS circuit 26. But the second NMOS transistor 36 fails to flow any current therethrough, since the second NMOS transistor 36 is in the non-conductive state. As a result, the low ECL logic level applied to the input terminal IN is converted to the high CMOS logic level at the output terminal OUT.

Thus, the first embodiment of the level conversion circuit according to the present invention may convert the ECL logic level signals into the CMOS logic level signals with the reduced speed and the reduced power consumption.

Figure 2:
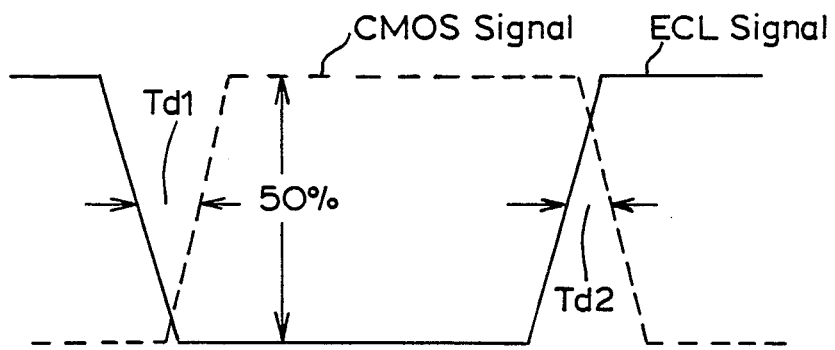
FIG. 2 is a level diagram showing level conversion operation of the circuit shown in FIG. 1.

FIG. 2 shows the level conversion characteristics of the first embodiment. In the FIG. 2, the solid line is a simulation graph of the input EC1 logic level signal and the broken line is a simulation graph of the output CMOS logic level signal. As seen from the FIG. 2, the output CMOS logic level signal has a delay time Td1 of about 2.3 nsec. (nano second) when the input EC1 logic level signal changes from the high level state to the low level state and a delay time Td2 of about 2.0 nsec. when the input ECL logic level signal changes from the low level state to the high level state. In the above, the delay times are measured by time dulations between the times the respective signals change 50% of their amplitudes. On the other hand, in the example of conventional level conversion circuits described above, the delay times Td1 and Td2 were 8.3 nsec. and 7.2 nsec.

Thus the first embodiment of the level conversion circuit according to the present invention performs the level conversion of the ECL logic level signals into the CMOS logic level signals at the higher speed, in compared to the example of conventional level conversion circuits.

Figure 3:
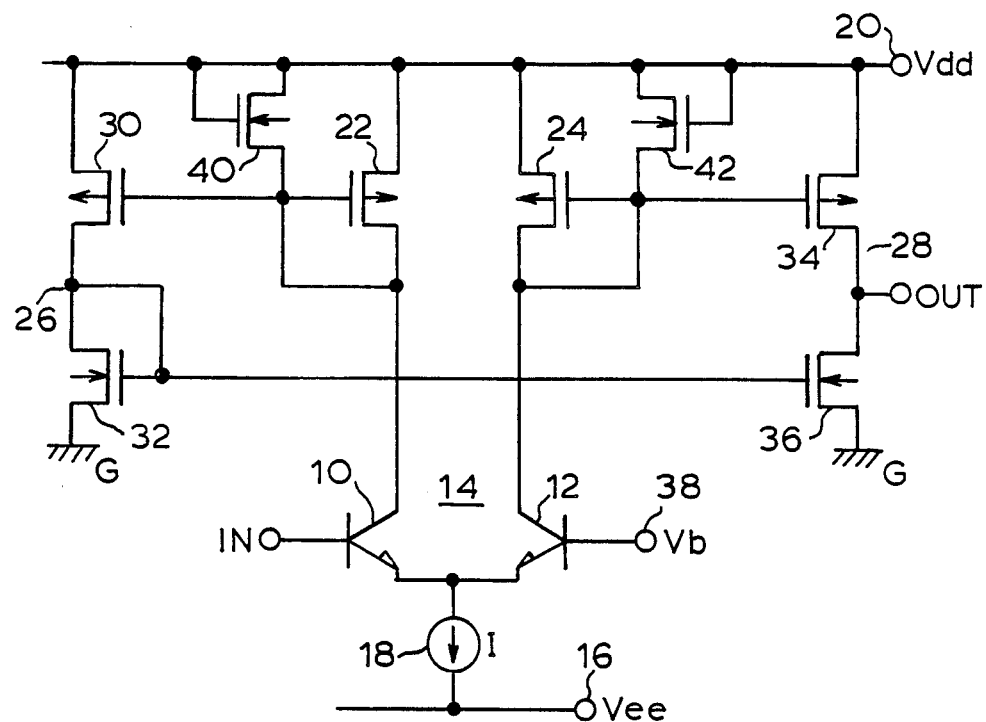
FIG. 3 is a schematic circuit diagram showing a second embodiment of the level conversion circuit according to the present invention.

Referring now to FIG. 3, there is shown a second embodiment of the level conversion circuit according to the present invention. The second embodiment of the level conversion circuit includes all of the components of the level conversion circuit shown in FIG. 1 and further includes two additional components of third and fourth NMOS transistors 40 and 42. All of the components in FIG. 3 which are identical to those of FIG. 1 have been designated by the same reference numerals. Since the differences between FIG. 1 and FIG. 3 resides in the connection of the additional third and fourth NMOS transistors 40 and 42, only these connections will now be explained.

The third NMOS transistor 40 has its source and gate terminals both connected to the Vdd potential source 20 together, and its drain terminal connected to the connection node of the gate terminals of the first and third PMOS transistors 22 and 30 and the drain terminal of the first PMOS transistor 22. The fourth NMOS transistor 42 also has its source and gate terminals both connected to the Vdd potential source 20 together, and its drain terminal connected to the connection node of the gate terminals of the second and fourth PMOS transistors 24 and 34 and the drain terminal of the first PMOS transistor 24.

An operation of the second embodiment of the level conversion circuit of the present invention will now be described. The third and fourth NMOS transistors 40 and 42 operate to flow currents supplied from the Vdd potential source 20 to the gate terminals of the PMOS transistors 22, 24, 30 and 34, respectively. That is, the third NMOS transistor 40 flows the current into the gate terminals of first and third PMOS transistors 22 and 30, when the first path of the diffential circuit 14, i.e., the first NPN transistor 10 and the first PMOS transistor 22 are activated by the input of the high level ECL logic signal. The fourth NMOS transistor 42 flows the current into the gate terminals of second and fourth PMOS transistors 24 and 34, when the second path of the diffential circuit 14, i.e., the second NPN transistor 12 and the second PMOS transistor 24 are activated by the input of the low level ECL logic signal. Due to the currents applied through the third and fourth NMOS transistors 40 and 42, the PMOS transistors 22, 24, 30 and 34 are reduced their turn-ON times, i.e., the times that the PMOS transistors change from the non-conductive state to the conductive state.

According to the second embodiment of the level conversion circuit, the output CMOS logic level signal has the delay time Td1 of about 2.27 nsec. (nano second) when the input EC1 logic level signal changes from the high level state to the low level state and the delay time Td2 of about 1.91 nsec. when the input EC1 logic level signal changes from the low level state to the high level state. In the above, the delay times are measured the times that the respective signals take to change 50% of their amplitudes just as in the first embodiment.

Thus the second embodiment of the level conversion circuit shown in FIG. 3 performs the level conversion of the ECL logic level signals into the CMOS logic level signals at a higher speed.

According to the invention, when either the P-channel MOS transistor or the N-channel MOS transistor which together form the output stage is in a conductive state, the other transistor becomes non-conductive state, enabling ECL logic level signals to be changed rapidly to CMOS logic level signals. In addition to which the consumption of electric power involved in this changing operation is reduced.

From the foregoing detailed description, it can thus be seen that the present invention provides a level conversion circuit to perform the level conversion of the ECL logic level signals into the CMOS logic level signals. The level conversion circuit of the present invention has the features of reduced circuit speed, low power consumption and high input impedance.

While there has been illustrated and described what are at present are believed to be preferred embodiment of the present invention, it will be understood by those skilled in the art various changes and modifications may be made, and equivalents may be substituted for elements thereof without departing from the true scope of the invention. In addition, many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention will include all embodiments following within the scope the appended claims.

What is claimed is:

1. A level conversion circuit for converting an ECL logic level signal to a CMOS logic level signal, comprising:
   a differential amplifier circuit comprising first and second bipolar transistors, each comprising a base, an emitter and a collector, the base of said first bipolar transistor connected to an input terminal, the base of said second bipolar transistor connected to a bias source terminal, the emitters of said bipolar transistors connected to each other, and the collector-emitter path of said first and second bipolar transistors connected in first and second parallel current paths between a high potential terminal and a low potential terminal;
   first and second current detector means respectively connected between the collectors of said first and second bipolar transistors and said high potential terminal for detecting current flowing in respective of said first and second bipolar transistors;
   a first PMOS transistor having a source connected to said high potential terminal, a drain connected to an output terminal, and a gate connected to the collector of said second bipolar transistor, wherein said first PMOS transistor is conductive upon current flow through said second current detector means and said second bipolar transistor;
   a first NMOS transistor having a drain connected to said output terminal, a source connected to a ground terminal, and a gate;
   said first current detection means comprising,
   a second PMOS transistor having a source coupled to said high potential terminal, a gate, and a drain connected to the gate of said second PMOS transistor and the collector of said first bipolar transistor, and
   a complementary MOS circuit comprising a third PMOS transistor having a gate connected to the gate of said second PMOS transistor, a source coupled to said high potential terminal, and a drain, and a second NMOS transistor having a drain coupled to the drain of said third PMOS transistor, a source connected to said ground potential terminal, and a gate connected to the drain of said second NMOS transistor and the gate of said first NMOS transistor;
   said second current detection means comprising a fourth PMOS transistor having a source coupled to said high potential terminal, a drain connected to the collector of said second bipolar transistor, and a gate connected to the drain of said fourth PMOS transistor and the gate of said first PMOS transistor; and
   a current source connected between the emitters of said first and second bipolar transistors and the low potential terminal.

2. A level conversion circuit according to claim 1, further comprising:
   a third NMOS transistor having a source and a gate connected together and to the high potential terminal and a drain connected to the gates of said first and fourth PMOS transistors; and
   a fourth NMOS transistor having a source and a gate connected to each other and to the high potential terminal and a drain connected to the gates of said second and third PMOS transistors

* * * * *